United States Patent
Domenicucci et al.

(10) Patent No.: US 7,208,414 B2
(45) Date of Patent: Apr. 24, 2007

(54) METHOD FOR ENHANCED UNI-DIRECTIONAL DIFFUSION OF METAL AND SUBSEQUENT SILICIDE FORMATION

(75) Inventors: Anthony G. Domenicucci, New Paltz, NY (US); Bradley P. Jones, Pleasant Valley, NY (US); Christian Lavoie, Ossining, NY (US); Robert J. Purtell, Mohegan Lake, NY (US); Yun Yu Wang, Poughquag, NY (US); Kwong Hon Wong, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 76 days.

(21) Appl. No.: 10/711,365

(22) Filed: Sep. 14, 2004

(65) Prior Publication Data

US 2006/0057844 A1    Mar. 16, 2006

(51) Int. Cl.
*H01L 21/44* (2006.01)
(52) U.S. Cl. ............ 438/683; 438/682; 438/649; 438/664; 438/E21.166; 257/769; 257/E21.199
(58) Field of Classification Search ........ 438/682–683, 438/649, 664; 257/769
See application file for complete search history.

(56) References Cited

U.S. PATENT DOCUMENTS

| | | | |
|---|---|---|---|
| 6,022,801 A | 2/2000 | Domenicucci et al. | |
| 6,124,639 A | 9/2000 | Domenicucci et al. | |
| 6,323,130 B1 | 11/2001 | Brodsky et al. | |
| 6,413,859 B1 * | 7/2002 | Cabral et al. | 438/649 |
| 6,417,567 B1 | 7/2002 | Domenicucci et al. | |
| 6,444,578 B1 | 9/2002 | Cabral, Jr. et al. | |

* cited by examiner

*Primary Examiner*—Dung A. Le
(74) *Attorney, Agent, or Firm*—Scully, Scott, Murphy & Presser, P.C.; Yuanmin Cai

(57) ABSTRACT

The present invention provides a method for enhancing uni-directional diffusion of a metal during silicidation by using a metal-containing silicon alloy in conjunction with a first anneal in which two distinct thermal cycles are performed. The first thermal cycle of the first anneal is performed at a temperature that is capable of enhancing the uni-directional diffusion of metal, e.g., Co and/or Ni, into a Si-containing layer. The first thermal cycle causes an amorphous metal-containing silicide to form. The second thermal cycle is performed at a temperature that converts the amorphous metal-containing silicide into a crystallized metal rich silicide that is substantially non-etchable as compared to the metal-containing silicon alloy layer or a pure metal-containing layer. Following the first anneal, a selective etch is performed to remove any unreacted metal-containing alloy layer from the structure. A second anneal is performed to convert the metal rich silicide phase formed by the two thermal cycles of the first anneal into a metal silicide phase that is in its lowest resistance phase. A metal silicide is provided whose thickness is self-limiting.

23 Claims, 4 Drawing Sheets

US 7,208,414 B2

METHOD FOR ENHANCED UNI-DIRECTIONAL DIFFUSION OF METAL AND SUBSEQUENT SILICIDE FORMATION

BACKGROUND OF INVENTION

The present invention relates to semiconductor devices, and more particularly to a method of enhancing the uni-directional diffusion of a metal during silicidation using an initial anneal that includes two distinct thermal steps (hereinafter thermal cycles). The present invention also relates to semiconductor structures that include the metal silicide produced using the method of the present invention.

One type of material commonly employed in fabricating ohmic contacts for semiconductor devices is metal suicides such as cobalt silicide (CoSi) or nickel silicide (NiSi). Metal suicides are typically fabricated using a conventional self-aligned silicide (i.e., salicide) process. In such a process and when CoSi contacts are desired, a blanket TiN/Co film is deposited over exposed Si-containing regions (e.g., source, drain and gate). A first annealing step that is performed at a temperature from about 400° to about 600° C. is then employed to form a cobalt monosilicide. A selective etch is then employed to strip the TiN cap and to remove any unreacted Co that was not converted into the cobalt monosilicide film. The cobalt monosilicide is then subjected to a second anneal which converts (i.e., transforms) the cobalt monosilicide into cobalt disilicide. As is known to those skilled in the art, cobalt disilicide has a lower resistance than cobalt monosilicide.

Despite being able to form metal silicide contacts, the self-aligned silicide process mentioned above has several problems associated therewith. In particular, in the conventional silicide process mentioned above, both the metal, e.g., Co, and Si interdiffuse through a thin oxide. This bi-lateral diffusion is illustrated in FIG. 1 A, wherein reference numeral 10 is a Si-containing material, reference numeral 12 is a Co layer, reference numeral 14 designated by the broken line is a native oxide layer, reference numeral 16 shows the direction of Si diffusion, and reference numeral 18 shows the direction of Co diffusion. As is shown, the Si diffuses up, while the Co diffuses down in the conventional self-aligned silicide process.

After formation of cobalt disilicide using the conventional self-aligned silicide process, there is a small precipitate of $SiO_2$ that forms in the cobalt disilicide film. This is shown, for example, in FIG. 1B wherein reference numeral 20 denotes the cobalt disilicide film and reference numeral 22 denotes the $SiO_2$ precipitate.

The $SiO_2$ precipitate 22 shown in FIG. 1B is originated from a native oxide that was present on the surface of the Si-containing material 10 prior to performing the self-aligned silicide process. The native oxide is difficult to remove even with the numerous surface cleaning methods that are presently available.

In addition to the above problem, the conventional self-aligned silicide process also creates Si-containing gate voiding issues, when the Si-containing gate width is below 70 nm. The voiding issue is shown in FIG. 1C. In the drawing, reference numeral 10 is a Si-containing substrate, reference numeral 24 is a Si-containing gate, reference numeral 20 is a cobalt disilicide film formed atop the Si-containing gate 24, reference numeral 26 is the void in the Si-containing gate 24, and reference numeral 28 is an insulator spacer that is present on the sidewalls of the Si-containing gate 24. The voiding issues mentioned above and depicted in FIG. 1C cause the resistance of the Si-containing gate 24 to increase.

A recent improvement in the conventional self-aligned silicide process has been described in co-assigned U.S. Pat. No. 6,323,130 B1 to Brodsky, et al. Specifically, the process disclosed in Brodsky, et al. includes the steps of: forming a metal silicon alloy layer containing less than about 30 atomic % Si, the remainder is Co and/or Ni, over a silicon-containing substrate containing an electronic device to be electrically contacted, first annealing the metal silicon alloy layer at a temperature from about 300° to about 500° C. so as to form a metal rich silicide layer that is substantially non-etchable compared to the metal silicon alloy or pure metal, selectively removing any unreacted metal silicon alloy over non-silicon regions, and second annealing the metal rich silicide layer under conditions effective in forming a metal silicide phase that is in its lowest resistance phase. An optional oxygen diffusion barrier layer may be formed over the metal silicon alloy layer prior to the first annealing step.

The process described by Brodsky, et al. undergoes a different diffusion mechanism in the first annealing step than the bi-directional diffusion mechanism mentioned above for the conventional self-aligned silicide process. In particular, only Co diffuses downward forming a metal rich silicide layer in the process disclosed by Brodsky, et al. The resultant uni-directional mechanism achieved using the Brodsky, et al. process is illustrated in FIG. 2A. In this drawing, reference numeral 10 is a Si-containing material, reference 30 is the metal silicon alloy layer, reference numeral 14 is a native oxide layer, and reference numeral 18 shows the direction of Co diffusion.

As with the conventional self-aligned silicide process, the process disclosed in Brodsky, et al. removes any unreacted Co metal after the first annealing step. As indicated at Col. 5, lines 19–21 of Brodsky, et al., a mixture of hydrogen peroxide and sulfuric acid can be used as the etchant for removing the "residual" Co that was not transformed into a metal rich silicide phase. During this etching process, the Si in the Co metal oxidizes and forms a $SiO_2$ surface layer on the metal rich silicide. The structure is shown, for example in FIG. 2B, wherein reference numeral 32 is the metal rich silicide phase and reference numeral 22 is the surface $SiO_2$ layer.

Next, a second anneal is performed in the Brodsky, et al. process that transforms the metal rich silicide into cobalt disilicide. The second anneal is performed at a temperature from about 600° to about 900° C.

There are several advantages of the uni-directional diffusion mechanism achieved utilizing the process disclosed by Brodsky, et al. over the conventional self-aligned silicide process wherein bi-directional diffusion occurs. First, since the excess Co metal on top of the native oxide was etched away, there is no $SiO_2$ precipitate in the resultant cobalt disilicide film, which leads to low sheet resistance. Second, uni-directional diffusion has only the Co diffusing into Si and no Si is diffusing out, therefore, there are no void issues with narrow Si-containing gates.

Despite the improvements achieved with the process disclosed in Brodsky, et al., the Brodsky, et al. process results in a Co diffusion depth that is self-limiting. For example, in the first annealing step, a cobalt rich silicide film of about 3 nm is formed. After the strip and with the second anneal, the 3 nm cobalt rich silicide is transformed into a 12 nm cobalt disilicide film. In normal complementary metal oxide semiconductor (CMOS) processing, the contact reactive ion etch and sputter cleaning steps typically remove from about 10 to about 12 nm of cobalt disilicide, which is right at the boundary of cobalt disilicide formation for the process disclosed by Brodsky, et al. When the cobalt disilicide film is completely removed, a contact resistant problem with the metal to diffusion contact is evident.

In most CMOS applications, it is preferred to have a 18–24 nm cobalt disilicide process window issue. In normal processing, to increase the diffusion thickness, one would increase the first annealing temperature used in the silicide process. However, in this case, the maximum temperature is limited to about 450° C. because (i) higher temperature annealing would result in the formation of cobalt disilicide from the cobalt silicide alloy at the trench isolation regions, which leads to leakage, i.e., bridging, between different active areas on a substrate, an active area and the Si-containing gate, and between different Si-containing gates on the same substrate, and (ii) higher temperature anneals in the first annealing step lead to bi-directional diffusion, which leads to the same problems mentioned above in the conventional self-aligned silicide process.

In view of the above, there still exists a need for providing an improved method of forming metal silicide contacts that avoids the problems associated with the conventional self-aligned silicide process and with the silicide process mentioned in Brodsky, et al.

SUMMARY OF INVENTION

The present invention provides a method that further improves the silicide process disclosed in Brodsky, et al. Thus, the advantages mentioned in the Brodsky, et al. process, i.e., reducing Si consumption and bridging during silicide formation, are also achieved in the present invention. The improvement of the method of the present invention over the process disclosed in Brodsky, et al. is that the resultant metal silicide has an increased self-limiting thickness. That is, the method of the present invention provides a technique for fabricating metal silicide contacts that have an increased self-limiting thickness, thereby forming a metal silicide that will not be totally removed during the formation of metal interconnects to the metal silicide contact.

As indicated above, the Brodsky, et al. process provides a metal silicide whose thickness is about 12 nm. Such a thin metal silicide will be entirely, or substantially removed during subsequent interconnect processing steps. The entire or substantial removal of the metal silicide causes contact resistant problems with the metal to diffusion contact. This contact resistant problem is avoided in the present invention since the metal silicide formed has a thickness from about 14 to about 25 nm, preferably about 18 to about 25 nm. The increased thickness in the metal silicide contact is important in the semiconductor industry since it allows for the formation of metal contacts to the metal silicide contacts that have a lower portion (including sidewalls and a bottom wall) that is completely embedded within the silicide contact.

Moreover, the method of the present invention provides a structure including a thick metal silicide where low leakage is exhibited. By "low leakage", it is meant that there is little or no metal silicide that forms atop the trench isolation regions that are present in the structure.

The present invention achieves the above by using the metal silicon alloy disclosed in Brodsky, et al. and by utilizing a first anneal in which two distinct thermal cycles are performed. In accordance with the present invention, the first thermal cycle of the first anneal is performed at a temperature that is capable of enhancing the uni-directional diffusion of a refractory metal, such as Co, Ni or Co and Ni, into a Si-containing layer. The first thermal cycle causes the formation of an amorphous metal-containing (e.g., Co, Ni or Co and Ni) silicide. The second thermal cycle of the first anneal is performed at a temperature that converts the amorphous metal-containing silicide into a crystallized metal rich silicide that is substantially non-etchable as compared to the metal-containing silicon alloy layer or a pure metal-containing layer. Following the first anneal, which includes the two thermal cycles mentioned above, a selective etch is performed to remove any unreacted metal-containing silicon alloy layer from the structure. A second anneal is performed to convert the metal rich silicide phase formed by the two thermal cycles of the first anneal into a metal silicide phase that is in its lowest resistance phase. Although Co, Ni and alloys thereof are specifically mentioned as the metal used in forming the silicide contacts, other refractory metals such as, for example, Pt, are also contemplated herein.

In broad terms, the method of the present invention comprises the steps of: providing a structure comprising a metal-containing silicon alloy layer over a Si-containing material; subjecting said structure to a first anneal which comprises a first thermal cycle which is performed at a first temperature that enhances uni-directional diffusion of said metal into said Si-containing material thereby forming an amorphous metal-containing silicide and a second thermal cycle which is performed at a second temperature that converts the amorphous metal-containing silicide into a crystallized metal rich silicide that is substantially non-etchable as compared to the metal-containing silicon alloy layer; removing any unreacted metal-containing silicon alloy layer from the structure; and subjecting said structure to a second anneal at a third temperature that converts said crystallized metal rich silicide into a metal silicide phase that is in its lowest resistance phase.

In the above method, the metal of the metal-containing silicon alloy layer comprises any refractory metal or refractory metal alloy that is capable of reacting with silicon to form a metal silicide. Preferred metals are Co, Ni or alloys thereof.

An optional barrier layer that is resistant to oxygen diffusion may be formed over the metal-containing silicon alloy layer prior to the first anneal.

When Ni is employed as the metal, a Ni rich silicide phase is formed after the first anneal. The second anneal, which occurs after the removal step, converts the Ni rich silicide phase into Ni monosilicide which represents the lowest resistance silicide phase of Ni. On the other hand, when Co is employed, the first anneal converts the Co—Si alloy layer into a Co rich silicide layer and the second anneal, after the removal step, converts the metal rich silicide phase into a Co disilicide phase which represents the lowest resistance silicide phase of Co.

BRIEF DESCRIPTION OF DRAWINGS

FIG. 2A shows the uni-directional diffusion that occurs during the first anneal step, and FIG. 2B shows the structure after the selective etching step.

DETAILED DESCRIPTION

The present invention, which provides a method of forming a metal silicide atop a Si-containing material utilizing a first anneal that includes two distinct thermal cycles as well as the structure that is formed from the inventive method, will now be described in greater detail. It is noted that the drawings of the present application are provided for illustrative purposes and thus they are not drawn to scale.

Figure 1A:
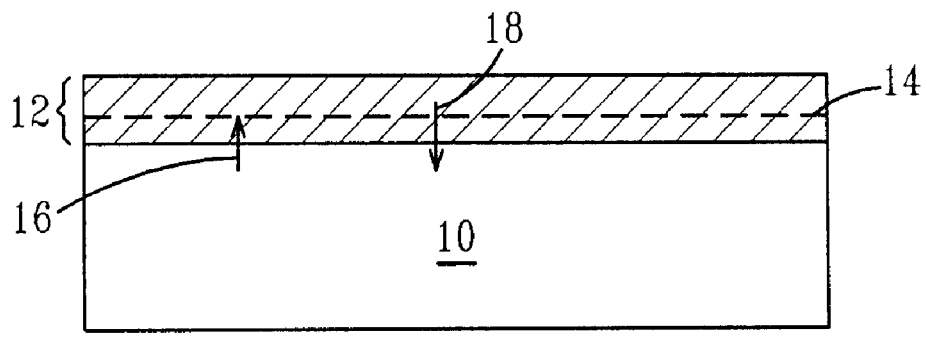
FIGS. 1A–1C are pictorial representations (through cross sectional views) illustrating problems that are associated with the conventional self-aligned silicide process.
Figure 1B:
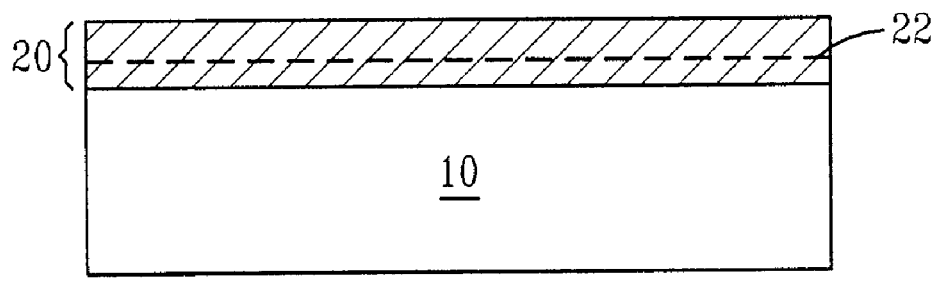
Figure 1C:
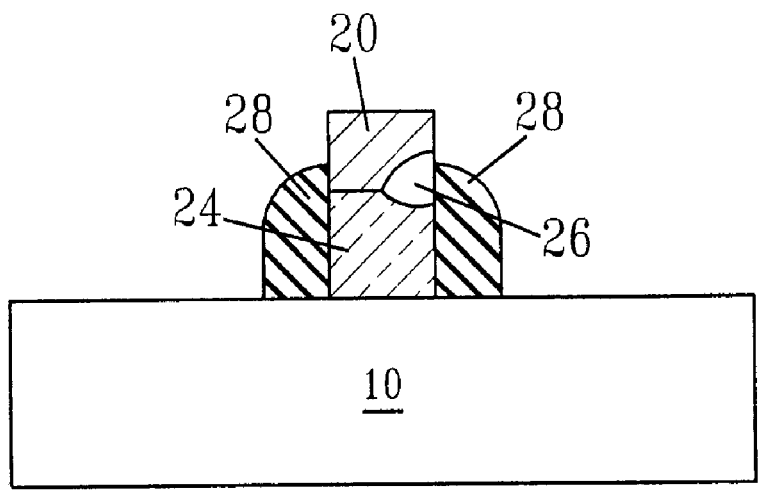
Figure 2A:
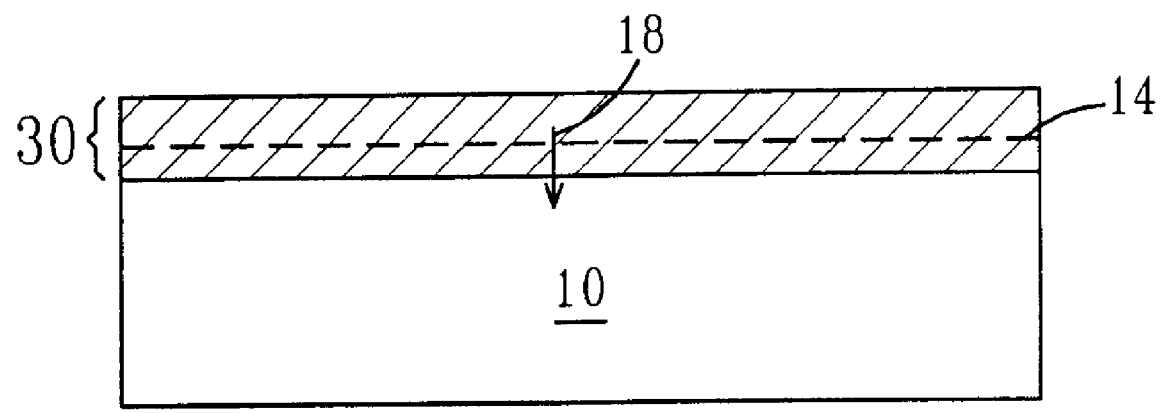
FIGS. 2A–2B are pictorial representations (through cross sectional views) illustrating the silicide process disclosed in Brodsky, et al.
Figure 2B:
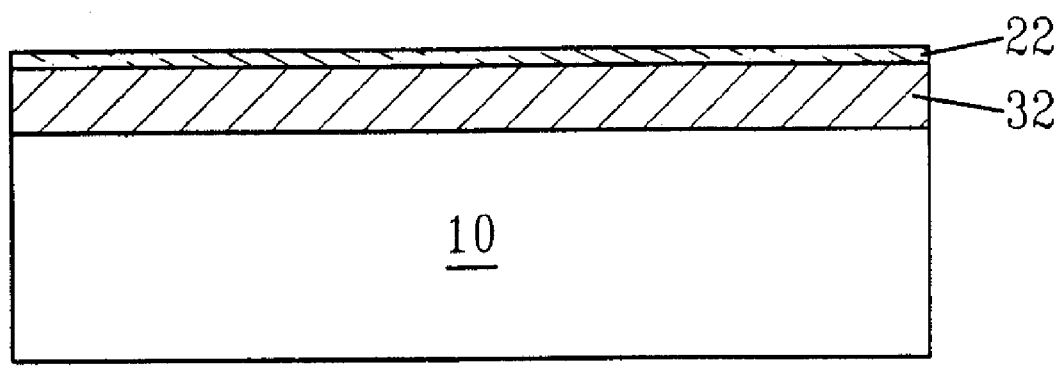
Figure 3A:
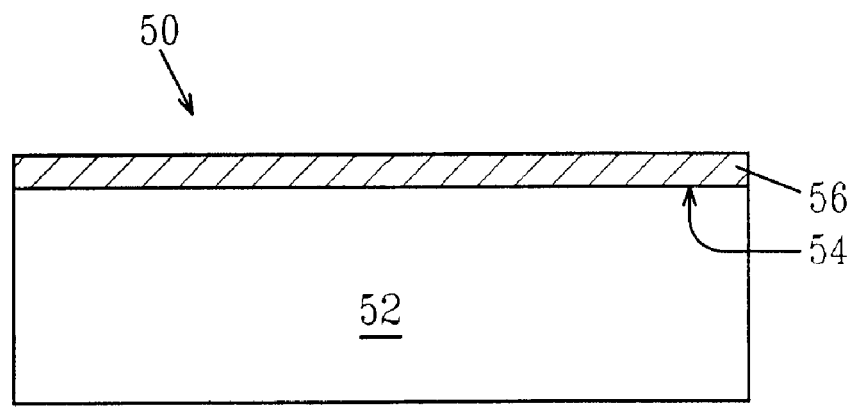
FIGS. 3A–3F are pictorial representations (through cross sectional views) illustrating the basic processing steps that are employed in the present invention for fabricating a metal silicide.

Reference is made to FIGS. 3A–3F which illustrate the basic processing steps of the present invention that are capable of forming a CMOS structure containing a low resistance thick metal silicide in which the Si consumption and the bridging has been significantly reduced. By "thick", it is meant a metal silicide that has a thickness from about 14 to about 25 nm. Specifically, FIG. 3A illustrates an initial structure 50 that is formed after the first step of the present invention has been performed. Specifically, the structure 50 comprises a Si-containing material 52 that has a metal-containing silicon alloy layer 56 located thereon. The Si-containing material 52 can be a Si-containing substrate, a gate electrode or both. The Si-containing material 52, especially if it is a substrate, may optionally include a surface oxide layer; the surface oxide layer is present before the alloy layer 56 deposition and is at the interface 54 between the alloy layer 56 and the Si-containing material 52.

Suitable Si-containing materials that can be used as layer 52 include, but are not limited to: single crystal Si, polycrystalline Si, SiGe, amorphous Si, silicon-on-insulator (SOI), silicon germanium-on-insulator (SGOI) and other like Si-containing materials. The Si-containing material 52 may be doped or undoped and it may include various isolation and device regions. These regions are not shown in the drawings, but are nevertheless intended to be included in the Si-containing material 52.

It is noted that when the Si-containing material 52 serves as a substrate, the Si-containing material 52 includes at least one electrical device, such as, for example, a field effect transistor (FET). In this embodiment, a metal silicide is formed in the region of the substrate that includes the source/drain diffusions of the FET. When the Si-containing material 52 serves as a gate electrode, the metal silicide can also be formed atop the gate electrode.

When present, the optional surface oxide layer is a thin oxide having a thickness from about 0.1 to about 3.0 nm. In one embodiment of the present invention, the surface oxide layer is completely removed from the structure 50 prior to employing the method of the present invention. In this embodiment, HF may be used to completely remove the surface oxide layer from the structure 50 prior to forming the metal-containing silicon (Si) alloy layer 56 thereon.

The metal-containing silicon alloy layer 56 is formed on the surface of the Si-containing material 52 (or over the optional surface oxide layer, if present) using a conventional deposition process that is well known to those skilled in the art. For example, the metal-containing Si alloy layer 56 can be formed by chemical vapor deposition, plasma-assisted chemical vapor deposition, evaporation, sputtering and other like deposition processes. Of these techniques, sputtering is typically employed in forming the metal-containing Si alloy layer 56. Alternatively, the metal-containing Si alloy layer 56 may be formed by first depositing a metal layer on the surface of the Si-containing material 52, and thereafter doping the metal layer with at least Si utilizing ion-implantation or another like doping process.

The metal-containing silicon alloy layer 56 of the present invention comprises silicon and at least one refractory metal or metal alloy that is capable of forming a metal silicide when it is reacted with silicon. Preferably, the metal within layer 56 is selected from the group consisting of Co, Ni and mixtures thereof. Thus in the preferred embodiment, the metal-containing silicon alloy layer 56 may comprise, a Co—Si alloy, a Ni—Si alloy, or a mixture of metals such as Co—Ni—Si. Of the preferred alloys, it is highly preferred that the metal-containing silicon alloy layer 56 comprises a Co—Si alloy. In accordance with the present invention, the metal-containing silicon alloy layer 56 typically includes less than about 30 atomic % Si. More typically, silicon is present in the alloy layer 56 in an amount from about 0.1 to about 20 atomic %.

The metal-containing silicon alloy layer 56 of the present invention may also include at least one additive which may effect the properties of the resultant silicide. The at least one additive that can be present in the alloy layer 56 can be used, for example, to lower the resistance of the silicide or, prevent agglomerization of the silicide. Illustrative examples of additives that can be used in the present invention as a component of the alloy layer 56 include, but are not limited to: C, Al, Ge, Sc, Ti, V, Cr, Mn, Fe, Cu, Y, Zr, Nb, Mo, Ru, Rh, Pd, In, Sn, La, Hf, Ta, W, Re, Ir, Pt, Ce, Pr, Nd, Sm, Eu, Gd, Tb, Dy, Ho, Er, Tm, Yb, Lu and mixtures thereof. Of these additives, C, Al, Ge, Sc, Ti, V, Cr, Mn, Fe, Cu, Y, Zr, Nb, Mo, Ru, Rh, Pd, In, Sn, La, Hf, Ta, W, Re, Ir, Pt or mixtures thereof are preferred.

When an additive is present, the at least one additive is typically present in the alloy layer 56 in an amount from about 0.01 to about 50 atomic (at.) %, with a range from about 0.1 to about 20 at. % being more typical. The at least one alloy additive can introduced during or after the deposition of the metal-containing Si alloy layer 56.

The term "metal-containing silicon alloy" is used herein to include compositions that have a uniform or non-uniform distribution of silicon therein, compositions having a gradient distribution of silicon therein, or mixtures and compounds thereof.

Figure 3B:
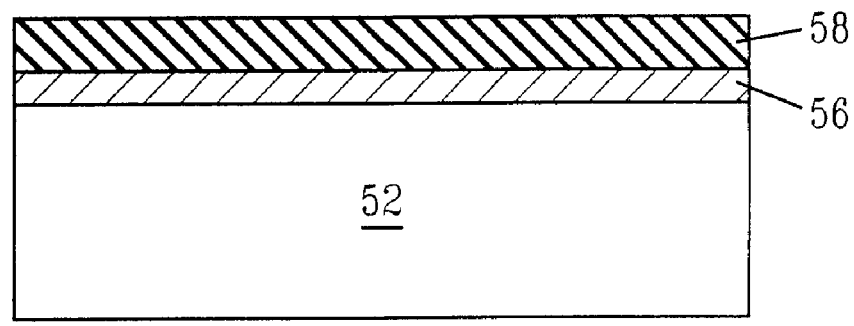

Next, as shown in FIG. 3B, an optional barrier layer 58 that is resistant to oxygen diffusion may be formed on the surface of the metal-containing silicon alloy layer 56. The optional barrier layer 58 is formed using a conventional deposition process that is well known to those skilled in the art. Illustrative examples of suitable deposition processes that can be employed in the present invention in forming the optional barrier layer 58 include, but are not limited to: chemical vapor deposition, plasma-assisted chemical vapor deposition, sputtering, evaporation, plating, spin-on coating and other like deposition processes. The thickness of the optional barrier layer 58 is not critical to the present invention as long as the optional barrier layer 58 is capable of preventing oxygen or another ambient gas from diffusing into the structure 50. Typically, the optional barrier layer 58 has a thickness from about 10 to about 30 nm.

The optional barrier layer 58 is composed of a conventional material that is well known in the art for preventing oxygen from diffusing into the structure 50. For example, TiN, $Si_3N_4$, TaN or another like material can be employed as the barrier layer 58. Although the drawings of the present invention show the presence of the optional barrier layer 58, it is possible to use the method of the present invention in cases wherein the optional barrier layer 58 is not present.

Figure 3C:
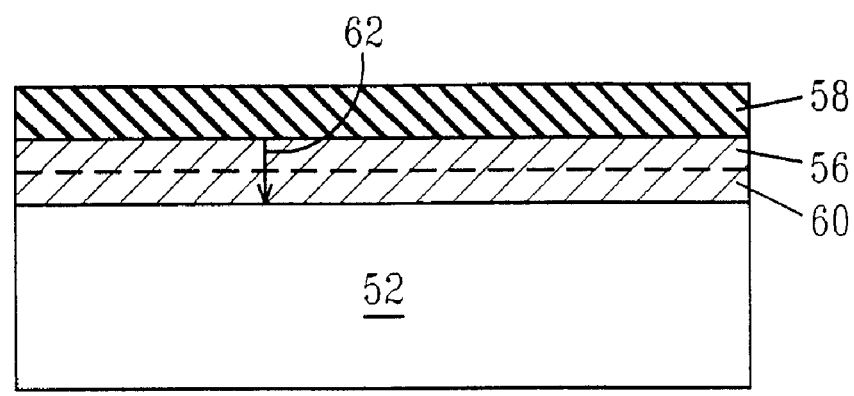

A first anneal is carried out on the structure shown in FIG. 3A or 3B. For completeness, the drawings depicted herein shown the first anneal being formed on a structure that includes the optional barrier layer 58. In accordance with the present invention, the first anneal includes two distinct thermal cycles. The first thermal cycle causes uni-directional diffusion of metal from the alloy layer 56 into the Si-containing material 54 and the subsequent formation of an amorphous metal-containing silicide phase. The structure formed after the first thermal cycle of the first anneal is shown in FIG. 3C. Specifically, the structure shown in FIG. 3C includes the Si-containing material 52, the metal-containing silicon alloy layer 56, an amorphous metal-containing silicide phase film 60 and the optional barrier layer 58. Reference numeral 62 denotes the direction of metal diffusion.

The first thermal cycle is performed at a first temperature Ti which enhances diffusion of metal and forms an amorphous metal silicide film. It is important that the temperature of the first thermal cycle of the first anneal does not cause the formation of a crystallized film. In accordance with the present invention, metal diffusion enhancement and amorphous phase formation can be achieved when the temperature of the first thermal cycle of the first anneal is less than about 350° C. Note that the temperature T1 of the first thermal cycle of the first anneal is less than the temperature T2 of the second thermal cycle of the first anneal. More typically, the first thermal cycle of the first anneal is performed at a temperature from about 270° to about 325° C. The first thermal cycle of the first anneal is typically performed for a time period from about 30 seconds to about 120 seconds. Other time periods besides the range exemplified herein are also contemplated.

Figure 3D:
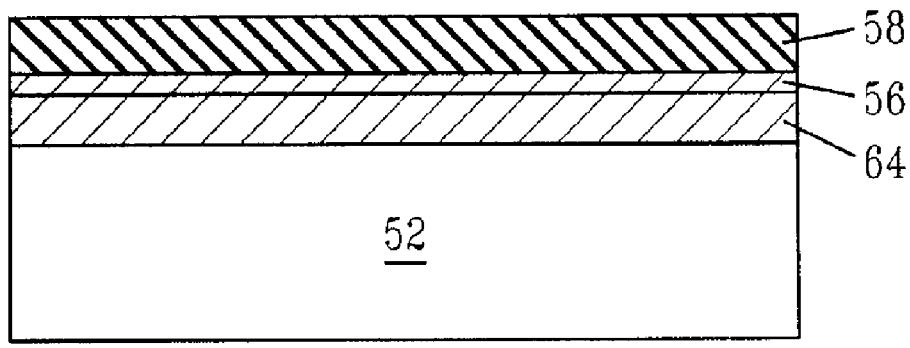

Next, the structure shown in FIG. 3C is subjected to a second thermal cycle (which is still, in accordance with the present terminology, considered to be with the first anneal) that is performed a temperature that converts the amorphous metal-containing silicide phase film 60 into a crystallized metal rich silicide phase film 64, See FIG. 3D.

The second thermal cycle of the first anneal is performed at a second temperature T2 that is less than 450° C., yet greater than Ti. More typically, the second thermal cycle of the first anneal is performed at a temperature from about 350° to about 400° C. The second thermal cycle of the first anneal is typically performed for a time period from about 10 seconds to about 30 seconds. Other time periods besides the range exemplified herein are also contemplated so long as the second thermal cycle of the first anneal is shorter than the first thermal cycle, i.e., Time 2<Time 1.

The two distinct thermal cycles mentioned above for the first anneal are rapid thermal anneal (RTA) processes that are performed in the same or different gas atmosphere, e.g., He, Ar, Ne or forming gas. Hence, the first anneal may also be considered to be a rapid thermal anneal step. The second thermal cycle of the first anneal may be performed immediately after the first thermal cycle, without any cool down between thermal cycles, or it can be performed any time period after cooling down from T1 to room temperature.

During the first anneal all of the metal-containing silicon alloy layer 56 may be consumed, or alternatively some of the alloy layer 56 may remain after annealing. This latter embodiment is shown in FIG. 3D. Furthermore, the surface oxide layer would be present in the metal rich silicide film 64 after the first anneal has been completed.

It is noted that the above conditions form a metal rich silicide layer 64 that is substantially non-etchable compared to the starting metal-containing silicon alloy 56 or pure metal; therefore higher annealing temperatures typically used in the conventional self-aligned silicide process providing this non-etchable metal silicide layer are avoided. As previously reported by Brodsky, et al., the use of a metal-containing silicon alloy permits the formation of a metal rich silicide layer at lower temperatures than possible utilizing prior art processes. Since lower temperatures are used in forming the metal rich silicide layer, the tendency for bridging is drastically reduced. Moreover, since the initial alloy film 56 contains silicon therein, a reduction in silicon consumption is observed using the method of the present invention.

After the first anneal which includes the aforementioned two distinct thermal cycles, the optional barrier layer 58 and any remaining metal-containing silicon alloy layer 56 (or any pure metal layer) is selectively removed from the structure (See, FIG. 3E) using conventional etching techniques that are well known to those skilled in the art.

Figure 3E:
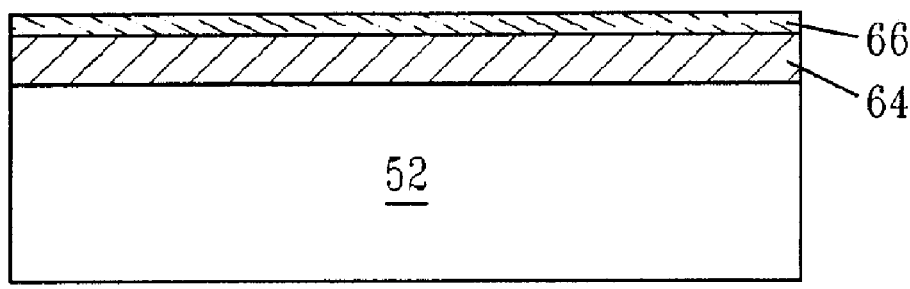
Figure 3F:
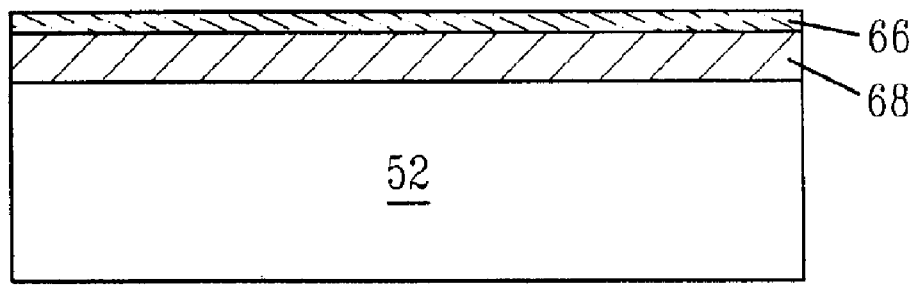

For example, any wet etch process may be used in removing the optional barrier layer 58 and the metal-containing silicon alloy layer 56 from the structure. The chemical etchant employed in the wet etch process must be highly selective in removing the barrier layer 58 and the metal-containing silicon alloy layer 56 as compared to the metal rich silicide layer (or film) 64. A suitable etchant that can be employed in the present invention is a mixture of hydrogen peroxide and nitric or sulfuric acid. Other chemical etchants can also be employed in the present invention. FIG. 3E shows the presence of a surface oxide layer 66 that forms after the wet etch process. The surface oxide layer 66 is a thin layer having a thickness from about 1 to about 5 nm.

It is also within the contemplation of the present invention to use a dry etch process in removing the optional barrier layer 58 and any remaining metal-containing silicon alloy layer 56 from the structure. A dry etching step avoids the formation of the surface oxide layer 66. Suitable dry etching techniques that can be used herein include, but are not limited to: reactive-ion etching, ion beam etching, plasma etching and other like dry etching techniques.

After removing the optional barrier layer 58 and any unreacted metal-containing silicon alloy layer 56 from the structure, a second anneal is employed in the present invention to convert the metal rich silicide layer 64 into a metal silicide phase of lowest resistance, e.g. Co disilicide or Ni monosilicide. The second anneal is carried out at a third temperature T3 that is higher than the temperature used in the first anneal (i.e., T3 is higher than T1 and T2). As stated above, the second anneal is carried out under conditions that are effective in converting the metal rich layer 64 into a silicide layer 68 having the lowest resistance silicide phase of the metal, See FIG. 3F. Note that surface oxide 66 remains in the structure after this step of the present invention has been performed. The surface oxide 66 can be removed from the structure in subsequent processing steps using techniques well known to those skilled in the art.

This second anneal is also carried out by RTA using a gas ambient. Typically, the second anneal is carried out at a temperature from about 600° to about 900° C. for a time period about 300 seconds or less using a continuous heating regime or a ramp and soak heating regime. Other temperatures and times are also contemplated herein so long as the conditions chosen are higher than the first anneal so that the lowest resistance silicide phase of the refractory metal, e.g., Co or Ni, is formed in the structure.

It is again emphasized that the present invention provides the following three advantages: a substantial reduction in Si consumption, a drastic reduction in the tendency for bridging and a metal silicide, e.g., of Co and/or Ni, in its lowest resistance phase that is thicker than that which is obtained from the process disclosed in Brodsky, et al. As indicated above, the resultant metal silicide formed in the Brodsky, et al. patent is about 12 nm, whereas the metal silicide formed in the present invention has a thickness from about 14 to about 25 nm. More typically, the metal silicide formed in the present invention has a thickness from about 18 to about 25 nm.

The structure of the present invention that results from the method described above thus comprises a Si-containing material 52 having a region that includes a layer of a metal silicide 68, wherein said metal silicide 68 is in its lowest resistance phase, e.g., Co disilicide or Ni monosilicide.

While the present invention has been particularly shown and described with respect to preferred embodiments thereof, it will be understood by those skilled in the art that the foregoing and other changes in forms and details may be made without departing from the scope and spirit of the present invention. It is therefore intended that the present invention not be limited to the exact forms and details described and illustrated, but fall within the scope of the appended claims.

What is claimed is:

1. A method of forming a metal silicide on a surface of a Si-containing material comprising the steps of:
   providing a structure comprising a metal-containing silicon alloy layer over a Si-containing material;
   subjecting said structure to a first anneal which comprises a first thermal cycle which is performed at a first temperature of less than about 350° C. that enhances uni-directional diffusion of said metal into said Si-containing material thereby forming an amorphous metal-containing silicide and a second thermal cycle which is performed at a second temperature that converts the amorphous metal-containing silicide into a crystallized metal rich silicide that is substantially non-etchable as compared to the metal-containing silicon alloy layer;
   removing any unreacted metal-containing silicon alloy layer from the structure; and
   subjecting said structure to a second anneal at a third temperature that converts said crystallized metal rich silicide into a metal silicide phase that is in its lowest resistance phase.

2. The method of claim 1 wherein said metal-containing silicon alloy layer is formed by deposition of the alloy layer or by first depositing a refractory metal to form a metal layer and then doping the refractory metal layer with silicon.

3. The method of claim 1 further comprising forming an optional barrier layer over said metal-containing silicon alloy layer prior to said first anneal, wherein said optional barrier layer is removed in said removing of the unreacted metal-containing silicon alloy layer.

4. The method of claim 1 wherein said metal-containing silicon alloy layer further comprises at least one additive selected from the group consisting of C, Al, Ge, Sc, Ti, V, Cr, Mn, Fe, Cu, Y, Zr, Nb, Mo, Ru, Rh, Pd, In, Sn, La, Hf, Ta, W, Re, Ir, Pt, Ce, Pr, Nd, Sm, Eu, Gd, Tb, Dy, Ho, Er, Tm, Yb, Lu and mixtures thereof.

5. The method of claim 1 wherein said metal-containing silicon alloy layer comprises less than about 30 atomic % Si.

6. The method of claim 1 wherein said metal-containing silicon alloy comprises Ni, Co or alloys thereof.

7. The method of claim 1 wherein said first temperature is less than said second temperature.

8. The method of claim 7 wherein said second temperature is less than about 450° C., yet greater than the first temperature.

9. The method of claim 8 wherein said second temperature is from about 350° to about 400° C.

10. The method of claim 1 wherein said first thermal cycle is performed for a time period from about 30 seconds to about 120 seconds.

11. The method of claim 1 wherein said second thermal cycle is performed for a time period from about 10 seconds to about 30 seconds.

12. The method of claim 1 wherein said removing comprises a wet etch process in which a chemical etchant is employed.

13. The method of claim 1 wherein said third temperature is from about 700° to about 900° C. and said second anneal is carried out for a time period from about 300 seconds or less.

14. A method of forming a cobalt disilicide on a surface of a Si-containing material comprising the steps of:
   providing a structure comprising a cobalt (Co) silicon alloy layer over a Si-containing material;
   subjecting said structure to a first anneal which comprises a first thermal cycle which is performed at a first temperature of less than about 350° C. that enhances uni-directional diffusion of Co into said Si-containing material thereby forming an amorphous Co silicide and a second thermal cycle which is performed at a second temperature that converts the amorphous Co silicide into a crystallized Co rich silicide that is substantially non-etchable as compared to the Co silicon alloy layer;
   removing any non-reacted Co silicon alloy layer from the structure; and
   subjecting said structure to a second anneal at a third temperature that converts said crystallized Co rich silicide into Co disilicide.

15. The method of claim 14 wherein said Co silicon alloy layer is formed by deposition of the alloy layer or by first depositing Co to form a metal layer and then doping the metal layer with silicon.

16. The method of claim 14 further comprising forming an optional barrier layer over said Co silicon alloy layer prior to said first anneal, wherein said optional barrier layer is removed in said removing of the Co silicon alloy layer.

17. The method of claim 14 wherein said Co silicon alloy layer further comprises at least one additive selected from the group consisting of C, Al, Ge, Sc, Ti, V, Cr, Mn, Fe, Cu, Y, Zr, Nb, Mo, Ru, Rh, Pd, In, Sn, La, Hf, Ta, W, Re, Ir, Pt, Ce, Pr, Nd, Sm, Eu, Gd, Tb, Dy, Ho, Er, Tm, Yb, Lu and mixtures thereof.

18. The method of claim 14 wherein said Co silicon alloy layer comprises less than about 30 atomic % Si.

19. The method of claim 14 wherein said first temperature is from about 270° to about 325° C.

20. The method of claim 14 wherein said second temperature is less than about 450° C., yet greater than the first temperature.

21. The method of claim 20 wherein said second temperature is from about 350° to about 400° C.

22. The method of claim 14 wherein said removing comprises a wet etch process in which a chemical etchant is employed.

23. The method of claim 14 wherein said third temperature is from about 700° to about 900° C. and said second anneal is carried out for a time period from about 300 seconds or less.

* * * * *